(12) United States Patent
Kim et al.

(10) Patent No.: US 9,825,108 B2
(45) Date of Patent: Nov. 21, 2017

(54) CURVED DISPLAY DEVICE

(71) Applicant: Samsung Display Co., Ltd., Yongin-si, Gyeonggi-do (KR)

(72) Inventors: Youngji Kim, Yongin-si (KR); Jungsu Kim, Yongin-si (KR); Dongmyung Shin, Yongin-si (KR); Jonggil Ryu, Yongin-si (KR); Sohra Han, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/177,248

(22) Filed: Jun. 8, 2016

(65) Prior Publication Data
US 2017/0062537 A1    Mar. 2, 2017

(30) Foreign Application Priority Data
Aug. 25, 2015    (KR) .................... 10-2015-0119827

(51) Int. Cl.
| | | |
|---|---|---|
| *H01L 29/04* | (2006.01) | |
| *H01L 29/10* | (2006.01) | |
| *H01L 31/00* | (2006.01) | |
| *H01L 27/32* | (2006.01) | |
| *H01L 51/52* | (2006.01) | |

(52) U.S. Cl.
CPC ........ *H01L 27/3248* (2013.01); *H01L 27/323* (2013.01); *H01L 51/5253* (2013.01); *H01L 51/5281* (2013.01)

(58) Field of Classification Search
CPC .................... H01L 27/3248; H01L 27/323; H01L 51/5253
USPC .................................................. 257/40, 59
See application file for complete search history.

(56) References Cited

U.S. PATENT DOCUMENTS

| | | |
|---|---|---|
| 2012/0181923 A1 | 7/2012 | Cho et al. |
| 2012/0241811 A1 | 9/2012 | Kim et al. |
| 2012/0256201 A1 | 10/2012 | Lee et al. |
| 2015/0042346 A1 | 2/2015 | Oh et al. |

FOREIGN PATENT DOCUMENTS

| | | |
|---|---|---|
| KR | 10-2012-0082736 A | 7/2012 |
| KR | 10-2012-0109083 A | 10/2012 |
| KR | 10-2012-0113555 A | 10/2012 |
| KR | 10-2012-0138037 A | 12/2012 |
| KR | 10-2015-0017991 A | 2/2015 |

*Primary Examiner* — Lex Malsawma
*Assistant Examiner* — Eric W Jones
(74) *Attorney, Agent, or Firm* — Knobbe Martens Olson & Bear LLP

(57) ABSTRACT

A curved display device is disclosed. In one aspect, the display device includes a substrate comprising a flat portion and at least one curved portion, a display unit comprising a first display area on the flat portion, and a second display area on the curved portion, and a thin-film encapsulating layer sealing the display unit, and comprising at least one organic layer and at least one inorganic layer. The display device also includes a functional layer over the thin-film encapsulating layer, wherein the thin-film encapsulating layer comprises a first region overlapping the curved portion, and a second region overlapping the flat portion. The inorganic layer contacts the functional layer, and wherein the inorganic layer has a first surface roughness in the first region different from a second surface roughness in the second region.

20 Claims, 5 Drawing Sheets

CURVED DISPLAY DEVICE

CROSS-REFERENCE TO RELATED APPLICATION

This application claims the benefit of Korean Patent Application No. 10-2015-0119827, filed on Aug. 25, 2015, in the Korean Intellectual Property Office, the disclosure of which is incorporated herein in its entirety by reference.

BACKGROUND

Field

The described technology generally relates to a curved display device.

Description of the Related Technology

Recently, packaging designs for electronic devices in branding and consumer purchasing decisions have become important. Thus, research and development has been emphasized for display panels that have various shapes. In particular, with the advent of flexible substrates (typically made of polymer sheets), the potential for applications of curved shapes has become apparent.

SUMMARY OF CERTAIN INVENTIVE ASPECTS

One inventive aspect relates to a curved display device that includes: a substrate including a flat part and at least one curved part; a display unit including a first display area on the flat part and a second display area on the at least one curved part; a thin-film encapsulating layer configured to seal the display unit and including at least one organic layer and at least one inorganic layer; and a functional layer on the thin-film encapsulating layer, wherein the thin-film encapsulating layer includes a first region overlapping the at least one curved part and a second region overlapping the flat part, the inorganic layer contacts the functional layer, and surface roughness of the inorganic layer in the first region is different from surface roughness of the inorganic layer in the second region.

The surface roughness of the inorganic layer in the first region may be greater than the surface roughness of the inorganic layer in the second region.

A root mean square (RMS) of the surface roughness of the inorganic layer in the first region may be 5 nm to 30 nm.

The RMS of the surface roughness of the inorganic layer in the first region may be 5 nm to 20 nm.

In the first region, the inorganic layer may include a concave-convex structure on a surface of the inorganic layer.

In the first region, the inorganic layer may include a first layer and a second layer on the first layer, and a density of the first layer may be greater than a density of the second layer.

The second layer may have a thickness that gradually decreases toward the second region.

The functional layer may include a polarizing layer or a touchscreen layer.

The display unit may include a thin-film transistor and a display device electrically connected to the thin-film transistor, and the display device may be an organic light-emitting device including a first electrode electrically connected to the thin-film transistor, a second electrode facing the first electrode, and an intermediate layer interposed between the first electrode and the second electrode.

The first display area and the second display area may be continuous with the second display area.

Another aspect is a curved display device that includes: a substrate including a flat part and at least one curved part continuous with the flat part; a display unit on the substrate; and a thin-film encapsulating layer configured to seal the display unit and including a plurality of organic layers and a plurality of inorganic layers which are alternately stacked, wherein an outermost inorganic layer among the plurality of inorganic layers includes a first region overlapping the at least one curved part and a second region overlapping the flat part, and surface roughness of the outermost inorganic layer in the first region is different from surface roughness of the outermost inorganic layer in the second region.

The curved display device may further include a functional layer on the thin-film encapsulating layer, wherein the outermost inorganic layer contacts the functional layer.

The functional layer may include a polarizing layer or a touchscreen layer.

In the first region, the outermost inorganic layer may include a concave-convex structure on a surface of the outermost inorganic layer.

In the first region, the outermost inorganic layer may include a first layer and a second layer on the first layer, and a density of the first layer may be greater than a density of the second layer.

The second layer may have a thickness that gradually decreases toward the second region.

A root mean square (RMS) of the surface roughness of the outermost inorganic layer in the first region may be 5 nm to 30 nm.

The RMS of the surface roughness of the outermost inorganic layer in the first region may be 5 nm to 20 nm.

The display unit may include a first display area on the flat part and a second display area on the at least one curved part and continuous with the first display area.

Each of the first display area and the second display area include a thin-film transistor and a display device electrically connected to the thin-film transistor, and the display device may be an organic light-emitting device including a first electrode electrically connected to the thin-film transistor, a second electrode facing the first electrode, and an intermediate layer interposed between the first electrode and the second electrode.

Another aspect is a curved display device comprising: a substrate comprising a flat portion and at least one curved portion; a display unit comprising a first display area on the flat portion, and a second display area on the curved portion; a thin-film encapsulating layer sealing the display unit, and comprising at least one organic layer and at least one inorganic layer; and a functional layer over the thin-film encapsulating layer, wherein the thin-film encapsulating layer comprises a first region overlapping the curved portion, and a second region overlapping the flat portion, and wherein the inorganic layer contacts the functional layer, and wherein the inorganic layer has a first surface roughness in the first region different from a second surface roughness in the second region.

In the above display device, the first surface roughness is greater than the second surface roughness. In the above display device, the root mean square (RMS) of the first surface roughness is about 5 nm to about 30 nm. In the above display device, the RMS of the first surface roughness is about 5 nm to about 20 nm. In the above display device, in the first region, the inorganic layer comprises a concave-convex structure on a surface of the inorganic layer.

In the above display device, in the first region, the inorganic layer comprises a first layer and a second layer over the first layer, and wherein the first layer has a density greater than that of the second layer. In the above display device, the second layer has a thickness that gradually decreases toward the second region. In the above display device, the functional layer comprises a polarizing layer or a touchscreen layer. In the above display device, the display unit comprises a thin-film transistor and a display device electrically connected to the thin-film transistor, and wherein the display device is an organic light-emitting device comprising a first electrode electrically connected to the thin-film transistor, a second electrode facing the first electrode, and an intermediate layer interposed between the first electrode and the second electrode. In the above display device, the second display area directly extends from the first display area.

Another aspect is a curved display device comprising: a substrate comprising a flat portion and at least one curved portion directly extending from the flat portion; a display unit over the substrate; and a thin-film encapsulating layer sealing the display unit, and comprising a plurality of organic layers and a plurality of inorganic layers which are alternately stacked, wherein the outermost inorganic layer of the inorganic layers comprises a first region overlapping the curved portion and a second region overlapping the flat portion, and wherein the outermost inorganic layer has a first surface roughness in the first region different from a second surface roughness in the second region.

The above display device further comprises a functional layer over the thin-film encapsulating layer, wherein the outermost inorganic layer contacts the functional layer. In the above display device, the functional layer comprises a polarizing layer or a touchscreen layer. In the above display device, in the first region, the outermost inorganic layer comprises a concave-convex structure on a surface of the inorganic layer. In the above display device, in the first region, the outermost inorganic layer comprises a first layer and a second layer over the first layer, and wherein the first layer has a density greater than that of the second layer. In the above display device, the second layer has a thickness that gradually decreases toward the second region.

In the above display device, the root mean square (RMS) of the first surface roughness is about 5 nm to about 30 nm. In the above display device, the RMS of the first surface roughness is about 5 nm to about 20 nm. In the above display device, the display unit comprises a first display area on the flat portion and a second display area on the curved portion and directly extending from the first display area. In the above display device, each of the first and second display areas comprises a thin-film transistor and a display device electrically connected to the thin-film transistor, and wherein the display device is an organic light-emitting device comprising a first electrode electrically connected to the thin-film transistor, a second electrode facing the first electrode, and an intermediate layer interposed between the first and second electrodes.

BRIEF DESCRIPTION OF THE DRAWINGS

These and/or other aspects will become apparent and more readily appreciated from the following description of the exemplary embodiments, taken in conjunction with the accompanying drawings.

DETAILED DESCRIPTION OF CERTAIN INVENTIVE EMBODIMENTS

Figure 1:
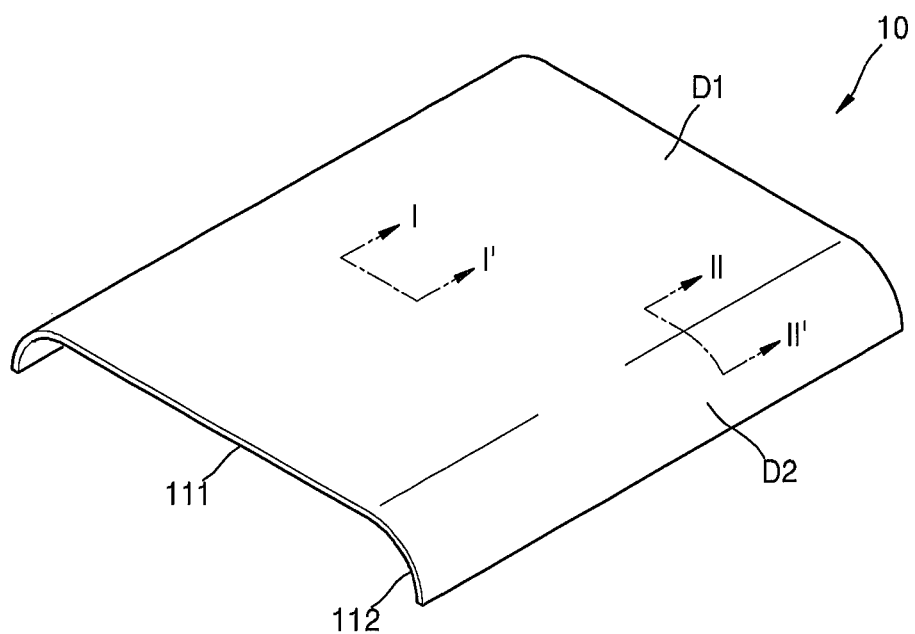
FIG. 1 illustrates a perspective view of a curved display device, according to an exemplary embodiment.

The inventive concept may allow various kinds of change or modification and various changes in form, and specific embodiments will be illustrated in drawings and described in detail in the specification. However, it should be understood that the specific embodiments do not limit the inventive concept to a specific disclosing form but include every modified, equivalent, or replaced one within the spirit and technical scope of the inventive concept. In the following description, well-known functions or constructions are not described in detail so as not to obscure the inventive concept with unnecessary detail.

Although terms, such as 'first' and 'second', can be used to describe various elements, the elements cannot be limited by the terms. The terms can be used to classify a certain element from another element.

The terminology used in the application is used only to describe specific embodiments and does not have any intention to limit the inventive concept. An expression in the singular includes an expression in the plural unless they are clearly different from each other in context. In the accompanying drawings, some components are exaggerated, omitted, or schematically shown for convenience and clarity of description, and sizes of components do not fully reflect actual sizes thereof.

In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Reference will now be made in detail to exemplary embodiments, examples of which are illustrated in the accompanying drawings. Those elements that are the same or are in correspondence are rendered the same reference numeral regardless of the figure number, and redundant explanations are omitted. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Figure 2:
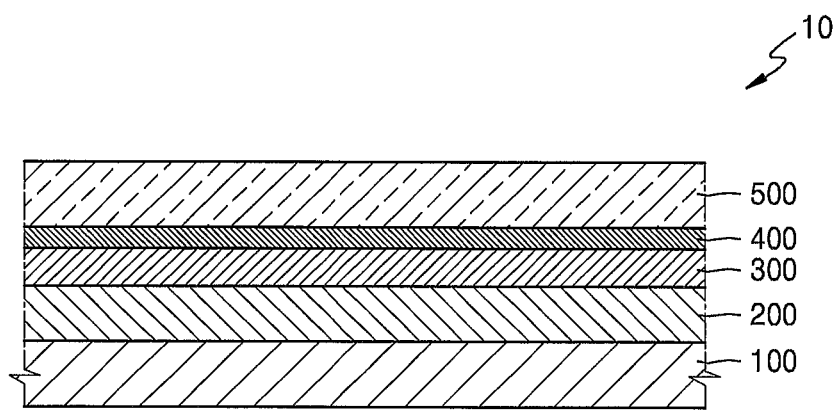
FIG. 2 illustrates a cross-sectional view of the curved display device, taken along line I-I' of FIG. 1, according to an exemplary embodiment.
Figure 3:
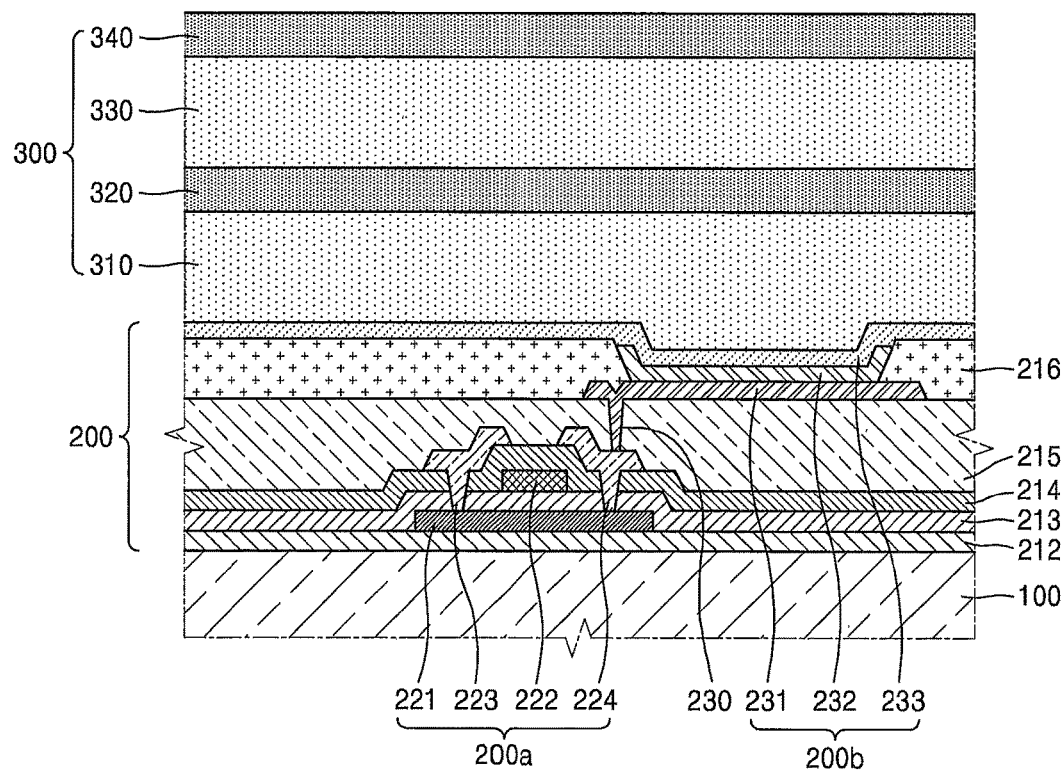
FIG. 3 illustrates a cross-sectional view of a display unit and a thin-film encapsulating layer in the curved display device of FIG. 2, according to an exemplary embodiment.

FIG. 1 illustrates a perspective view of a curved display device 10, according to an exemplary embodiment, FIG. 2 illustrates a cross-sectional view of the curved display device 10, taken along line I-P of FIG. 1, according to an exemplary embodiment, and FIG. 3 illustrates a cross-sectional view of a display unit 200 and a thin-film encapsulating layer 300 in the curved display device 10 of FIG. 2, according to an exemplary embodiment.

Referring to FIGS. 1 through 3, the curved display device 10 includes a substrate 100, the display unit 200 on the substrate 100, the thin-film encapsulating layer 300 configured to seal the display unit 200, and a functional layer 400 on the thin-film encapsulating layer 300. In addition, a cover layer 500 may be further formed on the functional layer 400.

The substrate 100 may include a flexible plastic material. For example, the substrate 100 may include polyethersulfone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), cellulose triacetate (TAC), cellulose acetate propionate (CAP), or the like.

In some embodiments, when the curved display device 10 is a bottom emission type display device in which an image is realized toward the substrate 100, the substrate 100 includes a transparent material. However, when the curved display device 10 is a top emission type display device in which an image is realized toward the thin-film encapsulating layer 300, the substrate 100 does not have to include a transparent material, and may include a flexible opaque metal. When the substrate 100 includes a metal material, the substrate 100 may include at least one of iron (Fe), chromium (Cr), manganese (Mn), nickel (Ni), titanium (Ti), molybdenum (Mo), stainless steel (SUS), an Invar alloy, an Inconel alloy, and a Kovar alloy. In addition, the substrate 100 may include a metal foil.

The substrate 100 may include a flat part or flat portion 111 and at least one curved part or curved portion 112. The curved part 112 is continuously formed from the flat part 111. FIG. 1 shows an example in which the substrate 100 includes a pair of curved parts 112 located at both sides of the flat part 111. The curved parts 112 may have the same shape or different shapes. In addition, the curved parts 112 may have a constant curvature or a variable curvature. However, the described technology is not limited thereto, and the curved part 112 may be formed in various manners, e.g., the curved part 112 may be formed at any one edge of the flat part 111, formed at all of the edges of the flat part 111, or formed inside the flat part 111.

The display unit 200 is formed over the substrate 100 and realizes an image. The display unit 200 may include a first display area D1 on the flat part 111 and a second display area D2 on the at least one curved part 112. The first display area D1 and the second display area D2 are continuously formed. The first and second display areas D1 and D2 may be implemented with one screen or may be implement with different screens.

The display unit 200 may include a thin-film transistor 200a and an organic light-emitting device 200b. However, the described technology is not limited thereto, and the display unit 200 may include various types of display devices. Hereinafter, the display unit 200 is described in more detail with reference to FIG. 3.

A buffer layer 212 may be formed over the substrate 100. The buffer layer 212 prevents infiltration of impurity elements through the substrate 100 and provides a flat surface to an upper part of the substrate 100. The buffer layer 212 may include an inorganic material such as silicon oxide, silicon nitride, silicon oxynitride, aluminum oxide, aluminum nitride, titanium oxide, or titanium nitride, or an organic material such as polyimide, polyester, acryl, or may be formed as a multi-stack including a plurality of ones among the inorganic and organic materials described above.

The thin-film transistor 200a may be formed over the substrate 100. The thin-film transistor 200a may include an active layer 221, a gate electrode 222, a source electrode 223, and a drain electrode 224.

The active layer 221 may be formed using an inorganic semiconductor such as silicon, or an organic semiconductor. In addition, the active layer 221 has a source region, a drain region, and a channel region between the source region and the drain region. For example, when the active layer 221 is formed using amorphous silicon, the active layer 221 including the source region, the drain region, and the channel region therebetween may be formed by forming an amorphous silicon layer on the whole surface of the substrate 100, by crystallizing the amorphous silicon layer so as to form a polycrystalline silicon layer, by patterning the polycrystalline silicon layer, and by doping the source region and the drain region at edges thereof with impurities.

A gate insulating layer 213 may be formed on the active layer 221. The gate insulating layer 213 is arranged so as to insulate the gate electrode 222 from the active layer 221 and may include an inorganic material such as silicon nitride ($SiN_x$), silicon oxide ($SiO_2$), or the like.

The gate electrode 222 may be formed on a certain region of the gate insulating layer 213. The gate electrode 222 is connected to a gate line (not shown) through which an on/off signal of the thin-film transistor 200a is applied. The gate electrode 222 may include gold (Au), silver (Ag), copper (Cu), Ni, platinum (Pt), palladium (Pd), aluminum (Al), or Mo or an alloy such as an Al:neodymium (Nd) alloy or an Mo:tungsten (W) alloy but is not limited thereto. That is, the gate electrode 222 may include various materials in accordance with design conditions.

An interlayer insulating layer 214 formed on the gate electrode 222 is to insulate between the gate electrode 222 and the source electrode 223 and between the gate electrode 222 and the drain electrode 224 and may include an inorganic material such as $SiN_x$ or $SiO_2$.

The source electrode 223 and the drain electrode 224 may be formed on the interlayer insulating layer 214. In an embodiment, the interlayer insulating layer 214 and the gate insulating layer 213 are formed so as to expose the source region and the drain region of the active layer 221, and the source electrode 223 and the drain electrode 224 are respectively formed as to contact the exposed source region and the exposed drain region of the active layer 221.

Each of the source electrode 223 and the drain electrode 224 may be formed as a single layer or a multi-layer including at least one of Al, Pt, Pd, Ag, magnesium (Mg), Au, Ni, Nd, iridium (Ir), Cr, lithium (Li), calcium (Ca), Mo, Ti, W, and Cu.

FIG. 3 illustrates the top gate type thin-film transistor 200a that sequentially includes the active layer 221, the gate electrode 222, the source electrode 223, and the drain electrode 224, but the described technology is not limited thereto, and the gate electrode 222 may be formed under the active layer 221.

The thin-film transistor 200a is electrically connected to the organic light-emitting device 200b and applies a signal for driving the organic light-emitting device 200b to the organic light-emitting device 200b. The thin-film transistor 200a may be covered by a planarization layer 215 and thus may be protected.

The planarization layer 215 may be an inorganic insulating layer and/or an organic insulating layer. The inorganic insulating layer may include $SiO_2$, $SiN_x$, silicon oxynitride (SiON), $Al_2O_3$, $TiO_2$, tantalum oxide ($Ta_2O_5$), hafnium oxide ($HfO_2$), zirconium oxide ($ZrO_2$), barium strontium titanate (BST), lead zirconate titanate (PZT), or the like, and the organic insulating layer may include polymer derivatives having commercial polymers such as Polymethylmethacrylate (PMMA) or Polystyrene (PS), and a phenol group, an acryl-based polymer, an imide-based polymer, an arylene ether-based polymer, an amide-based polymer, a fluorine-based polymer, a p-xylene-based polymer, a vinylalcohol-based polymer, or a combination thereof. Alternatively, the planarization layer 215 may be formed as a multi-stack including an inorganic insulating layer and an organic insulating layer.

The organic light-emitting device 200b may be formed over the planarization layer 215. The organic light-emitting device 200b may include a pixel electrode 231, an intermediate layer 232, and an opposite electrode 233.

The pixel electrode 231 is formed over the planarization layer 215 and is electrically connected to the drain electrode 224 through a contact hole 230 formed in the planarization layer 215.

The pixel electrode 231 may be a reflective electrode and may include a reflective layer including Ag, Mg, Al, Pt, Pd, Au, Ni, Nd, Ir, Cr, or a compound thereof and a transparent or translucent electrode layer formed on the reflective layer. The transparent or translucent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO).

The opposite electrode 233 formed to face the pixel electrode 231 may be a transparent or translucent electrode and may include a metal thin film having a small work function and including Li, Ca, lithium fluoride (LiF)/Ca, LiF/Al, Al, Ag, Mg, or a compound thereof. In addition, an assistant electrode layer or a bus electrode may be further formed on the metal thin film by using a transparent electrode forming material such as ITO, IZO, ZnO, or $In_2O_3$.

Therefore, the opposite electrode 233 may transmit light emitted from an organic emission layer (not shown) included in the intermediate layer 232. That is, the light emitted from the organic emission layer may be directly emitted toward the opposite electrode 233, or may be reflected by the pixel electrode 231 formed as the reflective electrode and then may be emitted toward the opposite electrode 233

However, the display unit 200 is not limited to the top emission type, and the display unit 200 may be a bottom emission type in which the light emitted from the organic emission layer is emitted toward the substrate 100. In this case, the pixel electrode 231 may be a transparent or translucent electrode, and the opposite electrode 233 may be a reflective electrode. Alternatively, the display unit 200 may be a dual-emission type in which light is emitted toward top and bottom surfaces of the curved display device 10.

A pixel-defining layer 216 including an insulating material may be formed over the pixel electrode 231. The pixel-defining layer 216 may be formed by a method such as spin coating using an organic insulating material including at least one of polyimide, polyamide, an acryl resin, benzocyclobutane, and a phenol resin. The pixel-defining layer 216 exposes a certain region of the pixel electrode 231, and the intermediate layer 232 including the organic emission layer is located in the exposed region.

The organic emission layer included in the intermediate layer 232 may include a small molecule organic material or a polymer organic material, and in addition to the organic emission layer, the intermediate layer 232 may further selectively include functional layers such as a hole transport layer (HTL), a hole injection layer (HIL), an electron transport layer (ETL), and an electron injection layer (EIL).

The thin-film encapsulating layer 300 may be formed over the opposite electrode 233. The thin-film encapsulating layer 300 may entirely cover the display unit 200 so that infiltration of external moisture and oxygen into the display unit 200 may be prevented. The thin-film encapsulating layer 300 may have an area that is greater than that of the display unit 200 so that all the edges of the thin-film encapsulating layer 300 may contact the substrate 100, and accordingly, infiltration of external air may be further firmly blocked.

The thin-film encapsulating layer 300 may include one or more organic layers 310 and 330 and one or more inorganic layers 320 and 340. The one or more organic layers 310 and 330 and the one or more inorganic layers 320 and 340 may be alternately stacked. FIG. 3 shows an example in which the thin-film encapsulating layer 300 includes two organic layers 310 and 330 and two inorganic layers 320 and 340, but the described technology is not limited thereto. That is, the thin-film encapsulating layer 300 may further include a plurality of additional inorganic layers and organic layers, and the number of times of inorganic and organic layers are stacked is not limited.

The inorganic layers 320 and 340 may include at least one of silicon nitride, aluminum nitride, zirconium nitride, titanium nitride, hafnium nitride, tantalum nitride, silicon oxide, aluminum oxide, titanium oxide, tin oxide, cerium oxide, and SiON.

The organic layers 310 and 330 may planarize a step difference due to the pixel-defining layer 216 and alleviate stress occurring in the inorganic layer 320. In addition, even if particles and the like exist on the inorganic layer 320, the organic layers 310 and 330 may evenly cover the particles and the like.

The inorganic layers 320 and 340 may by formed to have a larger size than that of the organic layers 310 and 330. Therefore, the inorganic layers 320 and 340 may contact each other in outer sides of edges of the organic layers 310 and 330, and accordingly, infiltration of external oxygen or moisture may be further effectively prevented.

The functional layer 400 may be formed over the thin-film encapsulating layer 300. The functional layer 400 may directly contact the outermost inorganic layer 340 of the thin-film encapsulating layer 300 by using an adhesive layer (not shown) or the like as a medium.

The functional layer 400 may include at least one of a polarizing layer and a touchscreen layer. In addition, the functional layer 400 may further include an optical film for reflecting external light and the like.

The polarizing layer may only transmit light, from the light emitted from the display unit 200, which vibrates in the same direction as a polarizing axis, and absorb or reflect light vibrating in the other directions. The polarizing layer may include a phase difference film configured to convert circular polarization into linear polarization or vice versa by granting a phase difference of $\lambda/4$ to two polarizing components that are orthogonal to each other, a polarizing film configured to align directions of the light which has transmitted through the phase difference film, to divide the aligned light into two polarizing components that are orthogonal to each other, to transmit one of the two polarizing components, and to absorb or scatter the other one of the two polarizing components, and the like.

The touchscreen layer may include a touch sensor in which a first electrode and a second electrode are crossly arranged. For example, the touch sensor may be a capacity-type touch sensor configured to determine a touch on a corresponding portion by detecting a change in a capacitance generated by a plurality of first electrodes and a plurality of second electrodes that are arranged while crossing each other.

The cover layer 500 may be formed on the functional layer 400 and may protect the curved display device 10 from an external shock, scratches occurring during use, and the like. The cover layer 500 may include polymethyl methacrylate, polydimethylsiloxane, polyimide, acrylate, polyethylene terephthalate, polyethylene naphthalate, or the like. However, the present exemplary embodiment is not limited thereto, and the cover layer 500 may include various materials, such as a metal material, and may include a thin metal foil, such as SUS, in accordance with circumstances.

Figure 4:
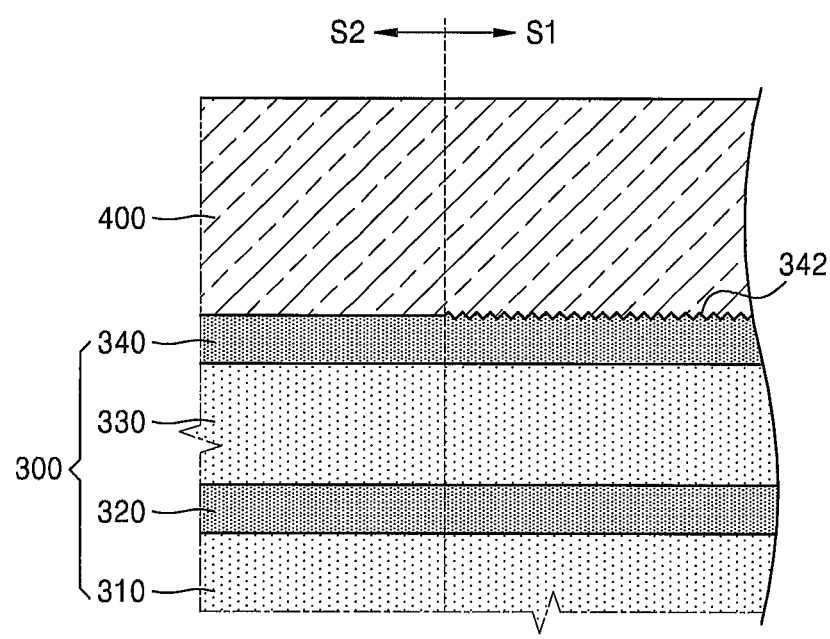
FIG. 4 illustrates a cross-sectional view of the curved display device, taken along line II-IP of FIG. 1, according to an exemplary embodiment.
Figure 5:
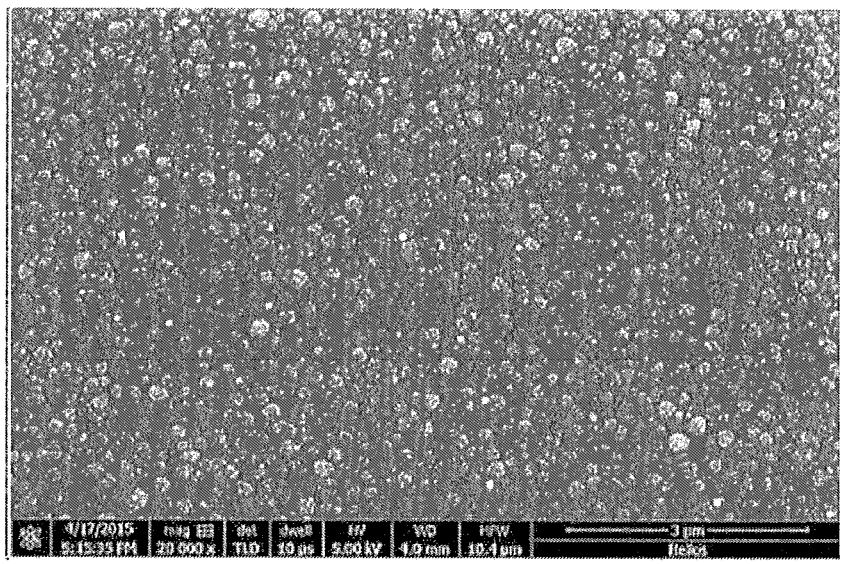
FIG. 5 illustrates a top view of the surface of the thin-film encapsulating layer in the curved display device of FIG. 2, according to an exemplary embodiment.
Figure 6:
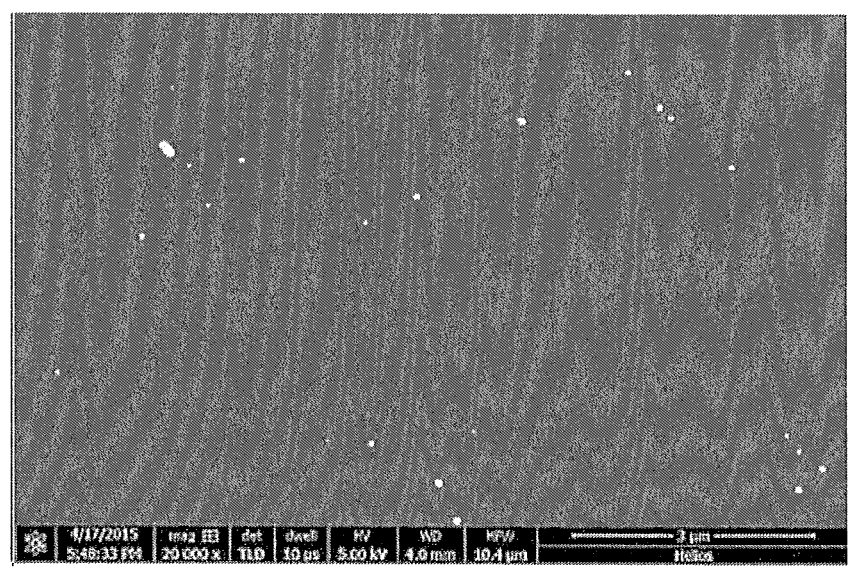
FIG. 6 illustrates a top view of the surface of the thin-film encapsulating layer in the curved display device of FIG. 2, according to another exemplary embodiment.

FIG. 4 illustrates a cross-sectional view of the curved display device 10, taken along line II-IP of FIG. 1, according to an exemplary embodiment, and FIGS. 5 and 6 illustrate top views of the surface of the thin-film encapsulating layer 300 in the curved display device 10 of FIG. 2, according to exemplary embodiments.

Referring to FIGS. 1 and 4, the thin-film encapsulating layer 300 may include a first region S1 and a second region S2. The first region S1 overlaps the covered part 112 of the substrate 100, and the second region S2 overlaps the flat part 111 of the substrate 100. That is, the first region S1 has a shape curved substantially along a shape of the covered part 112, but for convenience of description, FIG. 4 shows the first region S1 and the second region S2 on the same plane.

The thin-film encapsulating layer 300 may include a first organic layer 310, a first inorganic layer 320, a second organic layer 330, and a second inorganic layer 340 which are sequentially stacked. The first and second inorganic layers 320 and 340 may prevent or minimize infiltration of moisture and oxygen from the environment. The first and second organic layers 310 and 330 may respectively alleviate internal stress of the first and second inorganic layers 320 and 340 and may improve flatness by covering particles and the like. The second inorganic layer 340 may be the outermost layer of the thin-film encapsulating layer 300 and contacts the functional layer 400.

The second inorganic layer 340 may have different surface levels of roughness in the first region S1 and the second region S2. In an exemplary embodiment, the second inorganic layer 340 may be formed so that the surface roughness (or the first surface roughness) of the first region S1 may be greater than the surface roughness (or the second surface roughness) of the second region S2. As described above, the first region S1 has a curved shape, and accordingly stress may occur there, thereby causing malfunction such as delamination between the thin-film encapsulating layer 300 and the functional layer 400. However, if the surface roughness of the second inorganic layer 340 that contacts the functional layer 400 in the first region S1 increases, an adhesive force with the functional layer 400 is improved, so that malfunction such as lifting or delamination of the functional layer 400 may be prevented. In addition, since the first region S1 overlaps the second display area D2, if the surface roughness of the second inorganic layer 340 in the first region S1 increases, scattering of light which occurs in the second display area D2 may also increase, so that visibility of the second display area D2 may be improved when the curved display device 10 is viewed straight.

A root mean square (RMS) of the surface roughness of the second inorganic layer 340 in the first region S1 may be about 5 nm to about 30 nm, or about 5 nm to about 20 nm. The above range may provide an optimum balance between the adhesive force and the size of a junction area. For example, the above range improves the adhesive force between the thin-film encapsulating layer 300 and the functional layer 400 and can maintain a further firm bonding state. However, depending on the embodiment, the RMS of the surface roughness of the second inorganic layer 340 in the first region S1 may be less than about 5 nm or greater than about 30 nm.

For example, the second inorganic layer 340 in the first region S1 may include a concave-convex structure 342 on a surface of the second inorganic layer 340. FIGS. 5 and 6 show protrusions and grooves formed on the surface of the second inorganic layer 340 in the first region S1 through, for example, plasma treatment. FIG. 5 shows an example in which the RMS of the surface roughness of the second inorganic layer 340 is 6 nm, and in this regard, delamination of the functional layer (polarizing layer) 400 did not occur. However, FIG. 6 shows an example in which the RMS of the surface roughness of the second inorganic layer 340 is 2.5 nm, and in this regard, delamination of the functional layer (polarizing layer) 400 occurred. Therefore, when the surface roughness of the second inorganic layer 340 that contacts the functional layer 400 in the first region S1 increases, a defect such as lifting or delamination of the functional layer 400 may be prevented.

With reference to FIGS. 4 to 6, the examples in which the second inorganic layer 340 includes the concave-convex structure 342 in the first region S1 have been described, but the described technology is not limited thereto. That is, the number of organic layers and inorganic layers included in the thin-film encapsulating layer 300 may be variously set, and in this case, an inorganic layer having the concave-convex structure 342 indicates the outermost inorganic layer of the thin-film encapsulating layer 300.

Figure 7:
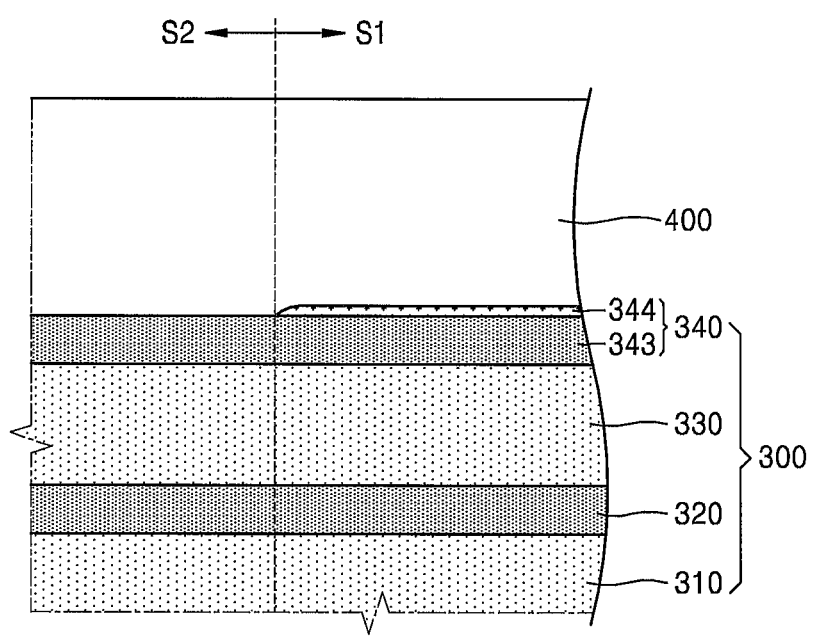
FIG. 7 illustrates a cross-sectional view of the curved display device, taken along line of FIG. 1, according to another exemplary embodiment.

FIG. 7 illustrates a cross-sectional view of the curved display device, taken along line II-II' of FIG. 1, according to another exemplary embodiment.

Referring to FIGS. 1 and 7, the thin-film encapsulating layer 300 may include the first region S1 overlapping the curved part 112, and the second region S2 overlapping the flat part 111. For convenience of description, FIG. 7 shows the first region S1, which actually has a curved shape, on the same plane as the second region S2.

For example, the thin-film encapsulating layer 300 may include the first organic layer 310, the first inorganic layer 320, the second organic layer 330, and the second inorganic layer 340 which are sequentially stacked, and in this regard, the second inorganic layer 340 that is the outermost layer contacts the functional layer 400. In this case, the second inorganic layer 340 may have different levels of surface roughness in the first region S1 and the second region S2. In an exemplary embodiment, the second inorganic layer 340 may be formed so that surface roughness of the first region S1 may be greater than surface roughness of the second region S2.

For example, in the first region S1, the second inorganic layer 340 may include a first layer 343 and a second layer 344 on the first layer 343. The first layer 343 and the second layer 344 may be formed by using same or different materials.

The first layer 343 may be formed all over the thin-film encapsulating layer 300 so as to prevent or minimize infiltration of external moisture and oxygen, and the second layer 344 may be formed in correspondence to the first region S1. In this case, a density of the first layer 343 may be greater than that of the second layer 344. That is, since the second layer 344 is more porous than the first layer 343, the surface roughness of the second inorganic layer 340 in the first region S1 may increase, and accordingly, a defect such as lifting or delamination of the functional layer 400 in the first region S1 having a curved shape may be prevented.

The second layer 344 may have a thickness that gradually decreases toward the second region S2. For example, the second layer 344 may have a tapered shape or a shape with which a convex shape is changed to a concave shape at an inflection point toward the first region S2. Therefore, it is possible to prevent a sudden step difference from occurring in the second inorganic layer 340, and accordingly, defective adhesion with respect to the functional layer 400 may be prevented.

According to at least one of the disclosed embodiments, the occurrence of a defect such as delamination between a thin-film encapsulating layer and a functional layer in a curved part of a curved display device may be prevented.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope as defined by the following claims.

What is claimed is:

1. A curved display device comprising:
    a substrate comprising a flat portion and at least one curved portion;
    a display unit comprising a first display area on the flat portion, and a second display area on the curved portion;
    a thin-film encapsulating layer sealing the display unit, and comprising at least one organic layer and at least one inorganic layer; and
    a functional layer over the thin-film encapsulating layer,
    wherein the thin-film encapsulating layer comprises a first region overlapping the curved portion, and a second region overlapping the flat portion, and
    wherein the inorganic layer contacts the functional layer, and wherein the inorganic layer has a first surface roughness in the first region different from a second surface roughness in the second region.

2. The curved display device of claim 1, wherein the first surface roughness is greater than the second surface roughness.

3. The curved display device of claim 2, wherein the root mean square (RMS) of the first surface roughness is about 5 nm to about 30 nm.

4. The curved display device of claim 2, wherein the RMS of the first surface roughness is about 5 nm to about 20 nm.

5. The curved display device of claim 2, wherein, in the first region, the inorganic layer comprises a concave-convex structure on a surface of the inorganic layer.

6. The curved display device of claim 2, wherein, in the first region, the inorganic layer comprises a first layer and a second layer over the first layer, and wherein the first layer has a density greater than that of the second layer.

7. The curved display device of claim 6, wherein the second layer has a thickness that gradually decreases toward the second region.

8. The curved display device of claim 1, wherein the functional layer comprises a polarizing layer or a touch-screen layer.

9. The curved display device of claim 1, wherein the display unit comprises a thin-film transistor and a display device electrically connected to the thin-film transistor, and
    wherein the display device is an organic light-emitting device comprising a first electrode electrically connected to the thin-film transistor, a second electrode facing the first electrode, and an intermediate layer interposed between the first electrode and the second electrode.

10. The curved display device of claim 1, wherein the second display area directly extends from the first display area.

11. A curved display device comprising:
    a substrate comprising a flat portion and at least one curved portion directly extending from the flat portion;
    a display unit over the substrate; and
    a thin-film encapsulating layer sealing the display unit, and comprising a plurality of organic layers and a plurality of inorganic, layers which are alternately stacked,
    wherein the outermost inorganic layer of the inorganic layers comprises a first region overlapping the curved portion and a second region overlapping the flat portion, and
    wherein the outermost inorganic layer has a first surface roughness in the first region different from a second surface roughness in the second region.

12. The curved display device of claim 11, further comprising a functional layer over the thin-film encapsulating layer, wherein the outermost inorganic layer contacts the functional layer.

13. The curved display device of claim 12, wherein the functional layer comprises a polarizing layer or a touch-screen layer.

14. The curved display device of claim 11, wherein, in the first region, the outermost inorganic layer comprises a concave-convex structure on a surface of the inorganic layer.

15. The curved display device of claim 11, wherein, in the first region, the outermost inorganic layer comprises a first layer and a second layer over the first layer, and wherein the first layer has a density greater than that of the second layer.

16. The curved display device of claim 15, wherein the second layer has a thickness that gradually decreases toward the second region.

17. The curved display device of claim 11, wherein the root mean square (RMS) of the first surface roughness is about 5 nm to about 30 nm.

18. The curved display device of claim 11, wherein the RMS of the first surface roughness is about 5 nm to about 20 nm.

19. The curved display device of claim 11, wherein the display unit comprises a first display area on the flat portion and a second display area on the curved portion and directly extending from the first display area.

20. The curved display device of claim 19, wherein each of the first and second display areas comprises a thin-film transistor and a display device electrically connected to the thin-film transistor, and wherein the display device is an organic light-emitting device comprising a first electrode electrically connected to the thin-film transistor, a second electrode facing the first electrode, and an intermediate layer interposed between the first and second electrodes.

* * * * *